(12) United States Patent
Tong-Viet

(10) Patent No.: US 9,253,929 B2
(45) Date of Patent: Feb. 2, 2016

(54) COOLING HOST MODULE

(71) Applicant: International Business Machines Corporation, Armonk, NY (US)

(72) Inventor: Emmanuel Tong-Viet, Montpellier (FR)

(73) Assignee: International Business Machines Corporation, Armonk, NY (US)

(*) Notice: Subject to any disclaimer, the term of this patent is extended or adjusted under 35 U.S.C. 154(b) by 203 days.

(21) Appl. No.: 14/045,255

(22) Filed: Oct. 3, 2013

(65) Prior Publication Data
US 2014/0071617 A1   Mar. 13, 2014

Related U.S. Application Data

(63) Continuation of application No. 13/924,800, filed on Jun. 24, 2013.

(30) Foreign Application Priority Data

Sep. 11, 2012   (GB) .................................. 1216173.3

(51) Int. Cl.
*G06F 1/20*     (2006.01)
*H05K 5/00*     (2006.01)
(Continued)

(52) U.S. Cl.
CPC .............. *H05K 7/20727* (2013.01); *G06F 1/20* (2013.01); *H05K 7/20754* (2013.01); *H05K 7/20809* (2013.01); *F24F 7/00* (2013.01); *F28F 13/00* (2013.01)

(58) Field of Classification Search
CPC .. G06F 1/20; H05K 7/20727; H05K 7/20809; F28F 13/00; F24F 7/00
USPC ............. 361/679.46, 679.47, 679.48–679.53, 361/690–697, 703; 454/184; 165/80.2, 165/104.21
See application file for complete search history.

(56) References Cited

U.S. PATENT DOCUMENTS

| 6,574,104 B2 | 6/2003 | Patel et al. |
| 7,856,838 B2 | 12/2010 | Hillis et al. |

(Continued)

FOREIGN PATENT DOCUMENTS

| EP | 0099092 A1 | 1/1984 |
| WO | 2007099542 A2 | 9/2007 |
| WO | 2007121811 A1 | 11/2007 |

OTHER PUBLICATIONS

Hewlett-Packard Development Co., "Optimizing facility operation in high density data center environments", technology brief, Aug. 2007, 26 pages.

(Continued)

*Primary Examiner* — Courtney Smith
*Assistant Examiner* — Zhengfu Feng
(74) *Attorney, Agent, or Firm* — Douglas A. Lashmit; Hoffman Warnick LLC

(57) ABSTRACT

A cooling host module is operable for providing cooling gas flow in a substantially isolated closed loop for a computing device. The computing device comprises a substantially vertical first face having an inlet portion comprising no more than about a lower third of a height of the first face for inlet gas flow and a substantially vertical second face opposite the first face for outlet gas flow. The cooling host module comprises: a heat exchanger adjacent to the second face of the computing device for cooling outlet gas flow; a gas flow path directing air exiting the heat exchanger beneath the computing unit; a gas moving device for moving gas in the gas flow path; and a vent towards distal end of the gas flow path for providing gas flow to the inlet portion of the first face of the computing device.

5 Claims, 2 Drawing Sheets

(51) Int. Cl.
  *H05K 7/20* (2006.01)
  *F28F 7/00* (2006.01)
  *F28D 15/00* (2006.01)
  *F28F 13/00* (2006.01)
  *F24F 7/00* (2006.01)

(56) References Cited

U.S. PATENT DOCUMENTS

| | | | |
|---|---|---|---|
| 8,164,897 B2 | 4/2012 | Graybill et al. | |
| 2003/0050003 A1 | 3/2003 | Charron | |
| 2004/0099747 A1* | 5/2004 | Johnson et al. | 236/49.3 |
| 2005/0219812 A1 | 10/2005 | Strobel | |
| 2005/0237716 A1 | 10/2005 | Chu et al. | |
| 2008/0068791 A1 | 3/2008 | Ebermann | |
| 2008/0185446 A1 | 8/2008 | Tozer | |
| 2009/0009958 A1 | 1/2009 | Pflueger | |
| 2009/0241578 A1 | 10/2009 | Carlson et al. | |
| 2011/0077795 A1 | 3/2011 | VanGilder et al. | |
| 2011/0105010 A1 | 5/2011 | Day | |
| 2012/0006507 A1* | 1/2012 | Su et al. | 165/80.2 |

OTHER PUBLICATIONS

Niles et al., "Virtualization and Cloud Computing: Optimized Power, Cooling, and Management Maximizes Benefits", White Paper 118, Revision 3, Schneider Electric—Data Center Science Center, 2011, 14 pages.

Search Report for GB Application No. 1216173.3 dated Jun. 25, 2013, 4 pages.

Office Action for U.S. Appl. No. 13/924,800, dated Jul. 8, 2015, 19 pages.

First Office Action for U.S. Appl. No. 13/924,800, dated Sep. 8, 2015, 18 pages.

* cited by examiner

COOLING HOST MODULE

REFERENCE TO PRIOR APPLICATIONS

The current application is a continuation application of U.S. Utility application Ser. No. 13/924,800, which was filed on 24 Jun. 2013, which is hereby incorporated by reference, and which claimed the benefit of Patent Application No. GB1216173.3, which was filed on 11 Sep. 2012.

FIELD OF THE INVENTION

The present invention relates to the field of data center cooling. More particularly, the present invention relates to the provision of cooling for an individual computing device in a data center.

RELATED ART

The growth of computer networking, and particularly the rapid growth of the use of the Internet, has resulted in a rapid increase in demand for server computers. Most commonly, a number of modular server units, for example the modular computing units known as "blade" servers, are removably mounted in equipment racks. Typically, a large number of such racks are housed in a building known as a data center. In a data center, one or more large rooms are provided. Each room houses rows of equipment racks and their mounted servers, and associated cabling and network communication equipment.

In a commonly used arrangement, data center rooms are cooled by computer room air conditioning units (termed CRACs), which circulate cooled air which passes through the rack units for heat removal. Typically, a data center room comprises a raised floor above a plenum chamber through which cooled air is blown by CRAC units. Rows of server racks are mounted on the floor separated by aisles. Networks of vents in the floors of the aisles between rows of server racks allow cooled air from the plenum to rise into the aisles. From here the cooled air is typically drawn through the front of the racks by fans mounted in the racks.

Such a cooling arrangement is typically designed to maintain an operating temperature for air passing through the rack units, which is approximately uniform across all rack units. Some arrangements provide for adjusting air flow to particular areas of a data center. In U.S. Pat. No. 6,574,104, there is described a cooling system configured to adjust cooling fluid flow to various racks located throughout a data center based upon the detected or anticipated temperatures at various locations throughout the data center. Numerical modeling may be implemented to control the volume flow rate and velocity of the cooling fluid flow through each of the vents.

In U.S. Pat. No. 8,164,897, an apparatus is provided for facilitating cooling of an electronics rack of a data center. The apparatus includes: an air flow director mounted to the electronics rack to redirect air flow exhausting from the electronics rack through an air flow return pathway back towards an air inlet side of the rack; an air to liquid heat exchanger disposed within the air flow return pathway for cooling redirected air flow before exiting into the data center near the air inlet side of the rack; an air temperature sensor for monitoring air temperature of the redirected air flow; and an automated isolation door associated with the air flow director for automatically blocking air flow exhausting from the air outlet side of the electronics rack from passing through the air flow return pathway back towards the air inlet side of the rack responsive to temperature of the redirected air flow exceeding a defined temperature threshold.

It is sometimes desirable to be able to install in a data center a standalone computing device having operating requirements markedly different from those of already installed server rack units. This may arise if a mainframe or mid-range computer is installed in a data center and if this computer requires an operating environment, for example an optimum operating temperature, which is different from that of existing server rack units. In contrast to a server rack unit, such a computing device typically provides an air inlet towards the bottom of a front panel which is otherwise largely impervious to air flow. Air is distributed within the computing unit by suitable directing structures within the unit.

SUMMARY OF THE INVENTION

The present invention allows the operating environment of a computing unit in a data center to be cooled substantially independently of the other machines in the data center.

Viewed from a first aspect, the invention provides a cooling host module for providing cooling gas flow in a substantially isolated closed loop for a computing device. The computing device comprises a substantially vertical first face having an inlet portion comprising no more than about a lower 33% of a height of the first face for inlet gas flow and a substantially vertical second face opposite the first face for outlet gas flow. The cooling host module comprises: a heat exchanger adjacent to the second face of the computing device for cooling outlet gas flow; a gas flow path directing air exiting the heat exchanger beneath the computing unit; a gas moving device for moving gas in the gas flow path; and a vent towards a distal end of the gas flow path for providing gas flow to the inlet portion of the first face of the computing device.

In an embodiment, in the cooling host module, the gas moving device is a fan.

In an embodiment, in the cooling host module, the gas is ambient air.

In an embodiment, in the cooling host module, the vent comprises an opening shaped to direct gas flow towards the inlet portion of the first face of the computing device.

In an embodiment, in the cooling host module, the vent comprises an adjustably sized opening.

In an embodiment, in the cooling host module, the interface between the computing device second face and the cooling host module further comprises a sealing system peripheral to the outlet gas flow to ensure substantially all the gas flow enters the cooling host module.

In an embodiment, in the cooling host module, the computing device comprises one of a mainframe computer, a mid-range computer, a mini computer, and a server rack unit.

Viewed from a second aspect, the invention provides a method for cooling a computing device. The computing device comprises a substantially vertical first face having an inlet portion comprising no more than about a lower 33% of a height of the first face for inlet gas flow and a substantially vertical second face opposite the first face for outlet gas flow. The method comprises: providing a cooling host module for providing cooling gas flow in a substantially isolated closed loop; drawing outlet gas flow through a cooling host module heat exchanger adjacent to the second face of the computing device for cooling the gas; providing a gas flow path in the cooling host module for directing air exiting the heat exchanger beneath the computing unit; moving gas in the gas flow path by a gas moving device; and venting gas flow to the inlet portion of the first face of the computing device via a vent towards a distal end of the gas flow path.

In an embodiment, the method further provides that the gas moving device is a fan.

In an embodiment, the method further provides that the gas is ambient air.

In an embodiment, the method further provides that the venting is via a vent which comprises an opening shaped to direct gas flow towards the inlet portion of the first face of the computing device.

In an embodiment, the method further provides that the venting is via a vent which comprises an adjustably sized opening.

In an embodiment, the method further ensures that substantially all the outlet gas flow from the computing device enters the cooling host module by providing a sealing system at the interface between the computing device second face and the cooling host module peripheral to the outlet gas flow.

In an embodiment, the method further provides that the computing device comprises one of a mainframe computer, a mid-range computer, a mini computer, and a server rack unit.

Viewed from a third aspect, the invention provides a cooling system for a computing device. The computing device comprises a substantially vertical first face having an inlet portion comprising no more than about a lower 33% of a height of the first face for inlet gas flow and a substantially vertical second face opposite the first face for outlet gas flow. The cooling system comprises a cooling host module for providing cooling gas flow in a substantially isolated closed loop. The cooling host module comprises: a heat exchanger adjacent to the second face of the computing device for cooling outlet gas flow; a gas flow path directing air exiting the heat exchanger beneath the computing unit; a gas moving device for moving gas in the gas flow path; and a vent towards a distal end of the gas flow path for providing gas flow to the inlet portion of the first face of the computing device.

In an embodiment, in the cooling system, the gas moving device is a fan.

In an embodiment, in the cooling system, the gas is ambient air.

In an embodiment, in the cooling system, the vent comprises an opening shaped to direct gas flow towards the inlet portion of the first face of the computing device.

In an embodiment, in the cooling system, the vent comprises an adjustably sized opening.

In an embodiment, in the cooling system, the interface between the computing device second face and the cooling host module further comprises a sealing system peripheral to the outlet gas flow to ensure substantially all the gas flow enters the cooling host module.

In an embodiment, the cooling system is operable with a computing device comprising one of a mainframe computer, a mid-range computer, a mini computer, and a server rack unit.

BRIEF DESCRIPTION OF THE DRAWINGS

Embodiments of the invention will now be described, by way of example only, with reference to the accompanying drawings.

DETAILED DESCRIPTION OF THE INVENTION

Figure 1:
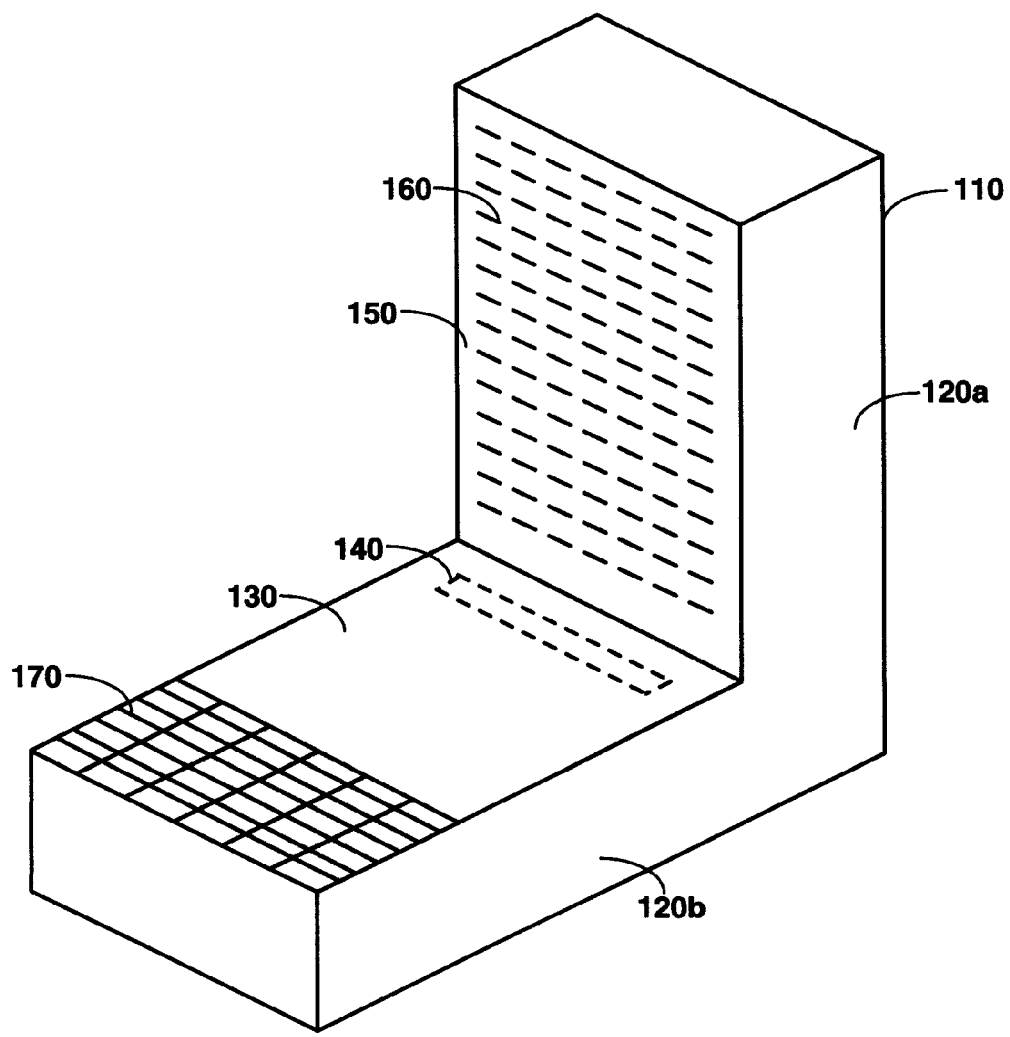
FIG. 1 illustrates a perspective view of a cooling host module in accordance with embodiments of the invention.

FIG. 1 illustrates a perspective view of a cooling host module 110 in accordance with embodiments of the present invention. The cooling host module 110 comprises a self-contained unit approximating an L-shape in front to back vertical cross-section of the module. The cooling host module 110 comprises a substantially vertical portion 120a and a substantially horizontal portion 120b, which together comprise a largely hollow internal chamber through which gas may flow. In embodiments this is the ambient air of the room within which the cooling host module 110 is installed, such as a data center room. The internal structure of the cooling host module 110 is typically provided with structural members of strength sufficient to maintain the integrity of the structure and bear the weight of a computing device installed thereon. The dimensions of the cooling host module 110 are calculated so as to provide an internal chamber of sufficient size to allow circulation of gas such as ambient air at a rate appropriate to the calculated cooling needs of an installed computing device. The chamber within the cooling host module 110 is sufficiently gas-tight so as to prevent mixing of significant quantities of circulated air with the air of the remainder of the room within which it is installed.

The horizontal portion 120b of the cooling module 110 comprises a substantially horizontal load-bearing upper surface 130 upon which stands a computing device (not shown) which is to be cooled. A services aperture 140 provides access for power and/or data cabling or other services provided to the computing device. Typically, the aperture 140 will include interlocking brushes, grommet arrangements, and/or the like to prevent as far as possible the passage of air via the aperture 140. A substantially vertical surface 150 of the vertical portion 120a of the cooling host module 110 allows passage of air exiting the rear face of the computing unit when in use into the internal chamber of the vertical portion 120a of the cooling host module 110. The vertical surface 150 may include an aperture or a network of apertures, for example formed from a mesh material.

Adjacent to the vertical surface 150 inside the vertical portion 120a is a heat exchanger 160, typically an air to liquid heat exchanger. The heat exchanger 160 may occupy a substantial part of the area of the vertical surface 150. Typically, heat exchanger 160 comprises a network of piping within which is circulated a coolant fluid, typically a coolant liquid, for example chilled water. Air entering the chamber within the vertical portion 120a of the cooling host module 110 is drawn through heat exchanger 160 and cooled thereby, and into the cooling host module 110, typically using a gas moving device such as an air mover within the cooling host module 110. Cooled air is drawn through the cooling host module 110, along the chamber within the horizontal portion 120b, and exits via a venting device 170 which is towards the distal end and on the upper surface of the horizontal portion 120b.

Figure 2A:
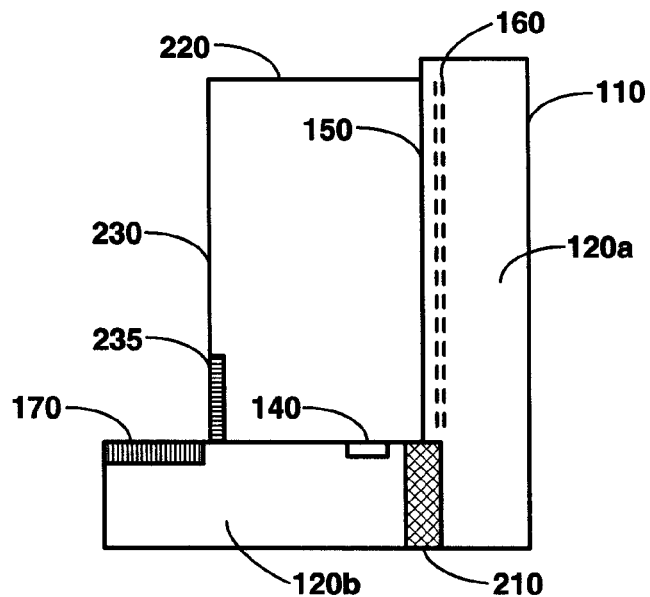
FIG. 2a illustrates a front to back vertical cross-section of a cooling host module and a computing device in an operational position, in accordance with embodiments of the present invention.

FIG. 2a illustrates a front to back vertical cross-section of the cooling host module 110 in accordance with embodiments of the present invention. In FIG. 2a, a computing device 220 is shown mounted in an operational position. The computing device 220 may be a mainframe computer, a mid-range computer, or a mini computer, for example. Such a computer may have very different cooling and other environmental requirements to those of other computing devices occupying the same room. The cooling host module 110 may be operated to regulate such conditions independently from those of the rest of the room. Advantageously, no major modifications are required to computing device 220 to enable it to operate with the cooling host module 110.

The computing device 220 is mounted on the cooling host module 110 with the rear surface of the computing device 220 closely adjacent to the vertical surface 150 of the cooling host module 110. Within the cooling host module 110, the heat exchanger 160 is positioned adjacent to the vertical surface 150. Both the vertical surface 150 and the heat exchanger 160 allow passage of air exiting from the computing device 220 into the chamber within the vertical portion 120a of the cooling host module 110. Inside the cooling host module 110 is positioned a gas moving device, such as an air mover 210. The air mover 210 may comprise a fan or fans operable to move air down the chamber within the vertical portion 120a and along the chamber within the horizontal portion 120b to exit at the venting device 170. The computing device 220 has a front panel 230 which may form an access door to the computing device 220. The front panel 230 is provided with an air inlet 235 at its lower end. This is illustrated as an inlet vent 235, but it will be apparent to one skilled in the art that it may comprise any suitable structure such as a mesh or louvered opening in the front panel 230. In some embodiments, the air inlet may be provided by having the front panel 230 spaced from the inner structure of the computing device 220, or from the upper surface 130 of the cooling host module 110, or both. The air inlet 235 may occupy only the lower part of the front panel 230, and in any case no more than about the lower 33% of the vertical height of the front panel 230. The venting device 170 in the cooling host module 110 may comprise a remotely adjustable venting opening. In some embodiments, the venting device 170 may be shaped so as to direct air towards the air inlet 235 in the lower portion of the front panel 230 of the computing device 220.

Figure 2B:
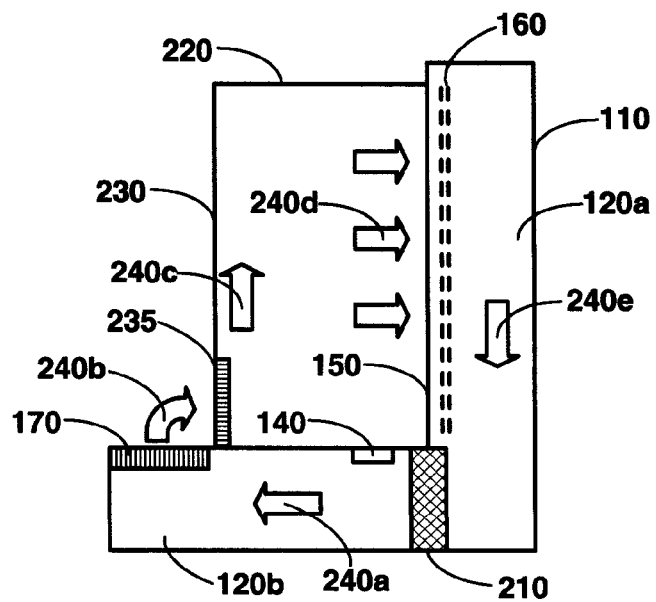
FIG. 2b illustrates a front to back vertical cross-section of a cooling host module and a computing device in an operational position showing air flow path, in accordance with embodiments of the present invention.

FIG. 2b illustrates a front to back vertical cross-section of the cooling host module 110 and the computing device 220 showing air flow through the computing device 220 and the chamber within the cooling host module 110 in operation thereof. The air mover 210 is illustrated mounted within the cooling host unit 110 at the foot of the vertical portion 120a. Typically, the air mover 210 comprises a fan or array of fans mounted in the chamber formed within the cooling host unit 110 so as to separate the vertical portion 120a from the horizontal portion 120b in such a way that air may only flow through the air mover 210. It will be understood that this illustrated arrangement is by way of example only and that other arrangements of components such as the air mover 210 are possible without departing from the scope of the invention. Control of the operation of the air mover 210 may therefore be used to regulate air flow to the computing device 220, for example where the air mover 210 is an array of fans regulation is by changing fan rotation speed.

The air mover 210 is operable to move air in the direction shown by arrow 240a along the chamber within the horizontal portion 120b. Towards the distal end of the horizontal portion 120b is the venting device 170. Air exits from the chamber within the horizontal portion 120b in a generally upwards direction through the venting device 170. The venting device 170 may comprise, for example, a remotely controllable opening which may be widened or narrowed to increase or decrease air flow therethrough as required. Air shown by arrow 240b is drawn into the computing device 220 through the air inlet 235 in the front panel 230. Within the computing device 220, directing structures, which may form part of the front panel 230, may be provided to channel air upwards in the direction of arrow 240c. Air is drawn through the computing device 220 as shown by arrows 240d past heat generating components requiring cooling, for example processing units.

Air exits the rear of the computing device 220 and enters the cooling host module 110 via the vertical surface 150. Air then passes through the heat exchanger 160 and is drawn down through the chamber within the vertical portion 120a in the direction of arrow 240e by the air mover 210. It will be understood that the computing device 220 may contain air movers such as fans to assist movement of cooling air. Alternatively, air circulation may be regulated solely by control of operation of the cooling host module 110 by for example changing the speed of the air mover 210 and/or the degree of opening of the venting device 170. Further control may be exercised by changing the temperature and/or flow rate of the coolant fluid within the heat exchanger 160 of the cooling host module 110.

It will be understood that efficient operation of the cooling host module 110 may require the maintenance of a sufficient degree of gas tightness in the system between air flow exiting the rear of the computing device 220, entering the cooling host module 110 via the vertical surface 150, flowing through chambers within the vertical portion 120a and the horizontal portion 120b, and exiting via the venting device 170. Ingress and egress of air to the air circulation system around the edges of the junction of the rear of the computing device 220 and the cooling host module 110 must be limited to a degree appropriate to maintaining sufficient negative pressure in the chamber of the vertical portion 120a so as to draw air exiting the computing device 220 into the cooling host module 110. This may be provided by merely ensuring close adjacency of the surfaces, or it may be assisted by using in addition a sealing system around the edges of the junction, such as an elastomeric strip. Similarly, the services access aperture 140 should have an appropriate level of sealing by using interlocking flexible brushes, grommet arrangements for cabling, or other suitable means.

In addition to illustrated features, in embodiments, the cooling host module 110 may be provided with all services necessary to support the mounted computing device 220. This may include all necessary power cabling and piping necessary to supply coolant fluid to the heat exchanger 160. It may also include suitable pass-through arrangements for power and data cabling necessary for operation of the computing device 220, for example via the aperture 140.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The invention claimed is:

1. A method for cooling a stand-alone computing device separate from a server rack, the stand-alone computing device comprising a substantially vertical first face having an inlet portion comprising no more than about a lower 33% of a height of the first face for inlet gas flow and a substantially vertical second face opposite the first face for outlet gas flow, the method comprising:
   providing a cooling host module for providing cooling gas flow in a substantially isolated closed loop through the stand-alone computing device, the cooling host module including a vertical portion and a horizontal portion, the stand-alone computing device supported by the horizontal portion of the cooling host module;

drawing outlet gas flow exiting through the second face of the stand-alone computing device into the vertical portion of the cooling host module, the outlet gas flow flowing through a heat exchanger disposed in the vertical portion of the cooling host module adjacent to the second face of the stand-alone computing device for cooling the gas;

providing a gas flow path in the in the vertical portion and the horizontal portion of the cooling host module for directing air exiting the heat exchanger into the horizontal portion of the cooling host module beneath the computing device;

moving gas in the gas flow path through the vertical portion of the cooling host module, through the horizontal portion of the cooling host module, and into and through an interior of the stand-alone computing device by a gas moving device, wherein negative pressure is maintained in the vertical portion of the cooling host module to draw the outlet gas flow exiting the stand-alone computing device into the vertical portion of the cooling host module;

providing a sealing system at an interface between the second face of the stand-alone computing device and the vertical portion of the cooling host module peripheral to the outlet gas flow, the sealing system ensuring that substantially all the outlet gas flow from the stand-alone computing device enters the cooling host module; and venting gas flow from a vent in a distal end of the horizontal portion of the cooling host module into the inlet portion of the first face of the stand-alone computing device to cool an interior of the stand-alone computing device, wherein the vent comprises an adjustably sized opening that adjusts the gas flow directed towards and into the inlet portion of the first face of the stand-alone computing device.

2. The method for cooling a stand-alone computing device as claimed in claim 1, wherein the gas moving device comprises a fan.

3. The method for cooling a stand-alone computing device as claimed in claim 1, wherein the gas comprises ambient air.

4. The method for cooling a stand-alone computing device as claimed in claim 1, wherein the vent comprises an opening shaped to direct gas flow towards and into the inlet portion of the first face of the stand-alone computing device.

5. The method for cooling a computing device as claimed in claim 1, wherein stand-alone the computing device comprises one of a mainframe computer, a mid-range computer, and a mini computer.

\* \* \* \* \*